United States Patent
Hull et al.

(10) Patent No.: US 6,931,992 B1
(45) Date of Patent: Aug. 23, 2005

(54) COMBINED ABLATION AND EXPOSURE SYSTEM AND METHOD

(75) Inventors: Frank A. Hull, East Bethel, MN (US); Benn Horrisberger, Shoreview, MN (US)

(73) Assignee: Cortron Corporation, Minneapolis, MN (US)

( * ) Notice: Subject to any disclaimer, the term of this patent is extended or adjusted under 35 U.S.C. 154(b) by 0 days.

(21) Appl. No.: 10/821,453

(22) Filed: Apr. 9, 2004

Related U.S. Application Data

(60) Provisional application No. 60/547,652, filed on Feb. 25, 2004.

(51) Int. Cl.[7] .............................................. B41N 1/14
(52) U.S. Cl. .................. 101/401.1; 101/467; 430/300; 347/233
(58) Field of Search .............................. 101/401.1, 467; 430/300, 302, 306; 347/233, 234, 238

(56) References Cited

U.S. PATENT DOCUMENTS

| | | | | |
|---|---|---|---|---|
| 5,351,617 A | * | 10/1994 | Williams et al. ............ | 101/467 |
| 5,540,150 A | * | 7/1996 | Lewis et al. ................ | 101/467 |
| 5,760,880 A | * | 6/1998 | Fan et al. ..................... | 355/67 |
| 2002/0069777 A1 | * | 6/2002 | Rossini et al. ........... | 101/401.1 |
| 2003/0075257 A1 | * | 4/2003 | Salvestro .................... | 156/64 |
| 2003/0211419 A1 | * | 11/2003 | Fan .......................... | 430/273.1 |
| 2004/0041990 A1 | * | 3/2004 | Wolber ........................ | 355/27 |

* cited by examiner

*Primary Examiner*—Eugene H. Eickholt
(74) *Attorney, Agent, or Firm*—Kinney & Lange, P.A.

(57) ABSTRACT

An exposure system is provided that surrounds a photopolymer on a rotating cylinder ablation system. The exposure system linearly follows the ablation source and operates to expose the ablated (masked) plate with high intensity illumination from all sides so as to continuously expose all points on the photopolymer.

27 Claims, 5 Drawing Sheets

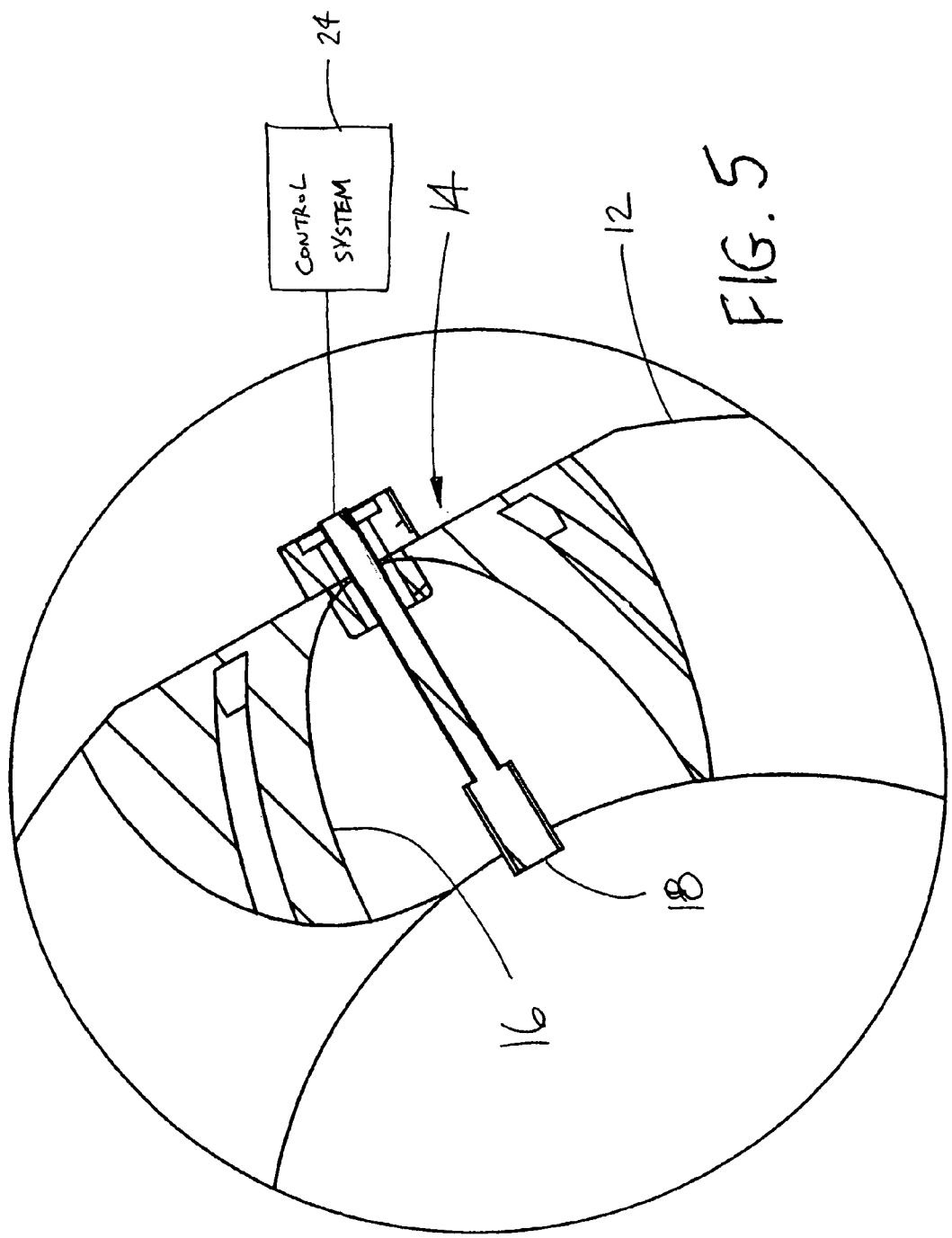

COMBINED ABLATION AND EXPOSURE SYSTEM AND METHOD

CROSS-REFERENCE TO RELATED APPLICATION(S)

This application claims priority from provisional application No. 60/547,652 filed Feb. 25, 2004, for "Combined Ablation and Exposure System and Method" by Frank A. Hull and Benn Horrisberger.

BACKGROUND OF THE INVENTION

The present invention relates to ablation and exposure of flexographic printing plates, and more particularly to a system and method of continuously exposing a flexographic plate on a rotating cylinder that is also used to ablate the plate.

Digital flexographic printing plates are conventionally exposed in two steps. The first step is to ablate the plate in a pattern that defines a mask on the plate. The mask represents the graphical image that the plate is used to print. This step is typically performed by placing the plate on a rotating cylinder and ablating the plate with a linearly movable imaging source controlled to ablate the desired image into the overcoat of the plate. The second step of the process is to expose the thereby masked plate to high intensity light, which results in a plate that is ready for processing. This step is typically performed by placing the masked plate on a flatbed and flooding the plate with high intensity light.

In the conventional two step process, great care must be taken in handling the plate after it has been ablated and before it has been exposed, as the carbon on the plate can be easily scratched or otherwise blemished in a way that renders useless the image represented on the plate. Flexographic plates are expensive, and losing plates due to corruption resulting from handling is therefore quite undesirable. In addition, flexographic plates can also be quite large in some applications, requiring a very large flatbed exposure device which can also be quite expensive.

One approach to solving this problem has been to provide an exposing apparatus that is integrated into the ablation system. A high intensity light source is provided that is movable along the cylinder on which the plate is placed, exposing the plate after it is ablated as it rotates on the cylinder. Although the high intensity light source provides light continuously, this configuration effectively provides a temporary pulse of light to each point of the plate (the pulse beginning when the point on the plate rotates into the field of light and ending when the point on the plate rotates out of the field of the light). Repeated pulses of light are not as effective in exposing the plate as continuous exposure, making this solution less than ideal.

It would be an improvement in the art to continuously expose masked flexographic printing plates without having to handle the plates between the processes of ablation and exposure.

SUMMARY OF THE INVENTION

The present invention is an exposure system that surrounds a photopolymer on a rotating cylinder ablation system. The exposure system linearly follows the ablation source and operates to expose the ablated (masked) plate with high intensity illumination from all sides so as to continuously expose all points on the photopolymer.

BRIEF DESCRIPTION OF THE DRAWINGS

FIG. 5 is an enlarged view of the portion of FIG. 4 that is shown in section, illustrating the configuration of each of the individual high intensity light sources provided around the circumference of the body of the exposure system.

DETAILED DESCRIPTION

The present invention provides an exposure system that surrounds a photopolymer such as a flexographic plate in a rotating cylinder ablation system, the exposure system linearly following the ablation source and operating to expose the ablated (masked) plate with high intensity illumination from all sides so as to continuously expose all points on the plate. The flexographic printing plate may be mounted to a rotating cylinder, or may itself be a cylindrical sleeve type of plate.

Figure 1A:
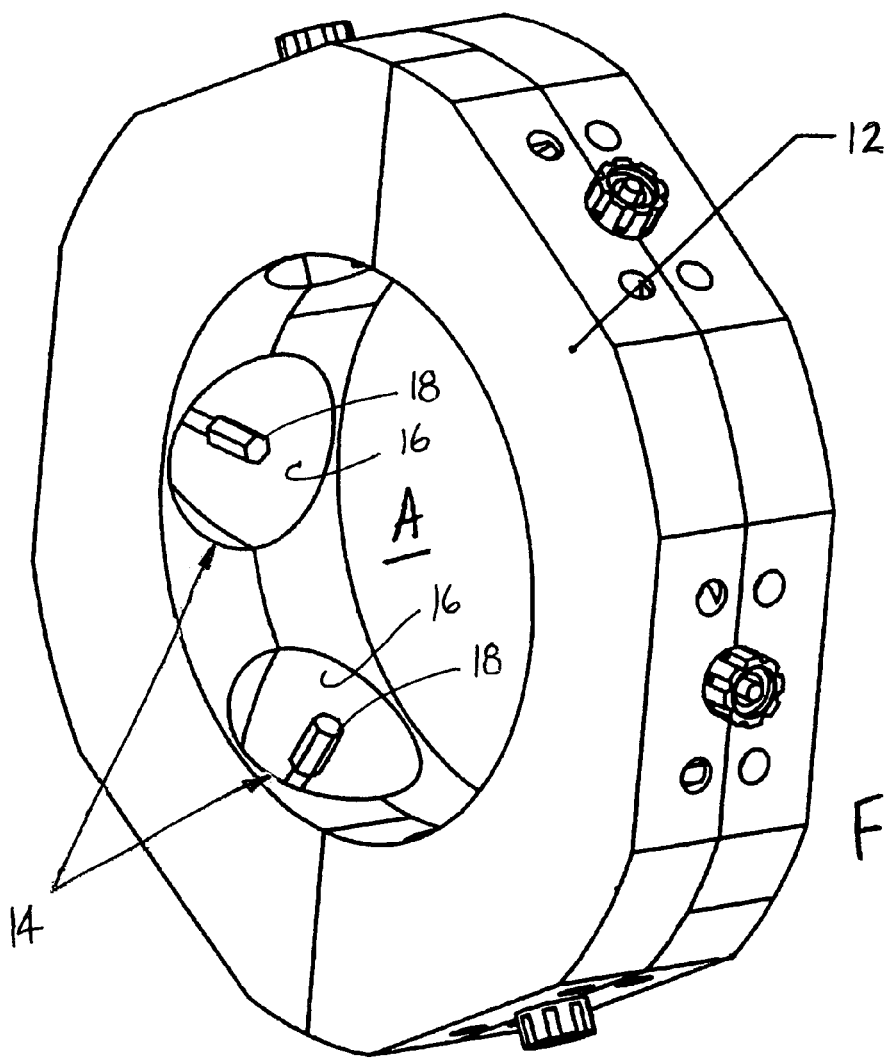
FIG. 1A is a perspective diagram.
Figure 1B:
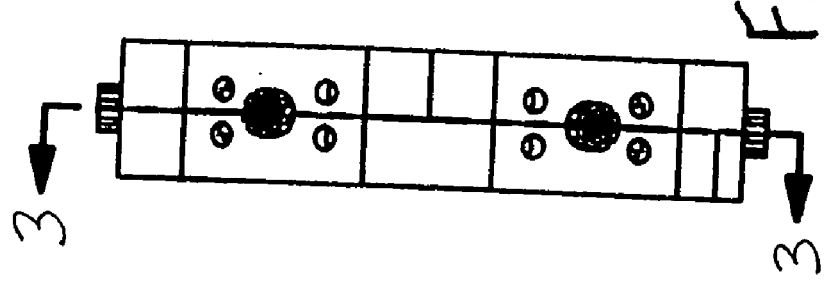
FIG. 1B is a side view, of the exposure system of the present invention.

FIG. 1A is a perspective diagram, and FIG. 1B is a side view, of exposure system 10 of the present invention. Body 12, having a toroidal geometry and being made of a material such as aluminum for example, is provided to surround a rotating cylinder (not shown in FIG. 1, but which fits inside aperture A) on which a flexographic plate is mounted. A plurality of high intensity light sources 14 are provided in body 12, each of which is operable to direct high intensity light inward toward the flexographic plate mounted on the rotating cylinder within aperture A. The entire assembly of body 12 and light sources 14 is water cooled by chambers (shown in FIG. 3) within body 12. Each light source 14 includes a reflector 16 surrounding a lamp 18, where reflectors 16 are dichroic coated to selectively reflect the light spectrum (ultraviolet light) required to polymerize the flexographic plate. The remaining light emission is absorbed into the liquid cooled body 12.

Figure 2:
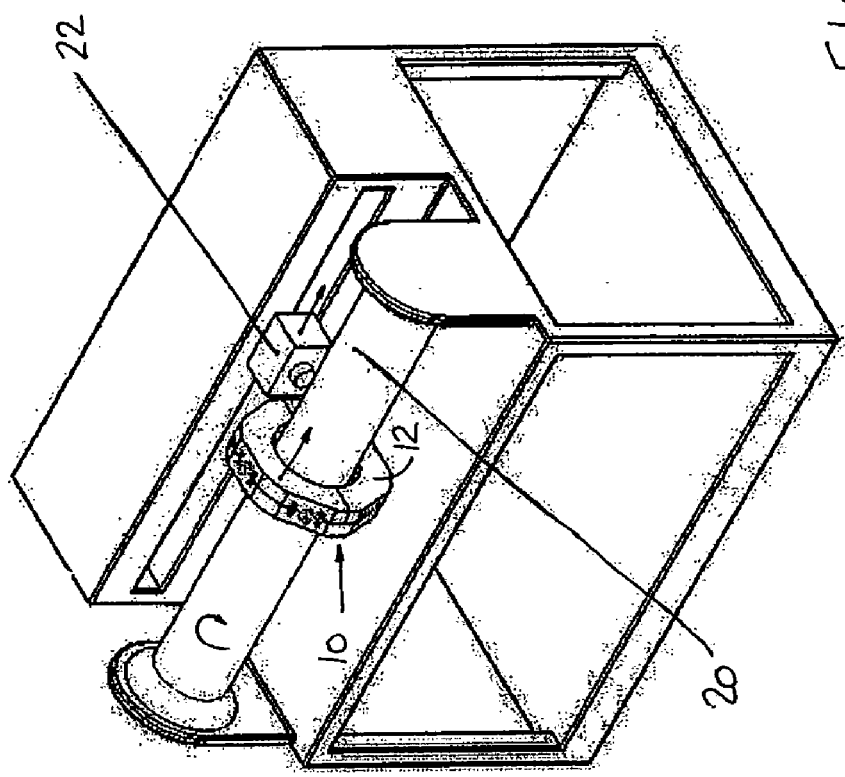
FIG. 2 is a perspective diagram illustrating the operation of the exposure system shown in FIGS. 1A and 1B in conjunction with an ablation system according to an exemplary embodiment of the present invention.

FIG. 2 is a perspective diagram illustrating the operation of exposure system 10 in conjunction with an ablation system according to an exemplary embodiment of the present invention. In operation, the entire body 12 of exposure system 10 is linearly moved along the length of the flexographic plate being ablated on rotating cylinder 20 (within aperture A (FIG. 1A)), so that body 12 follows ablating engine 22 and serves to expose ablated portions of the plate with high intensity light. Light sources 14 (FIG. 1A) are configured and arranged so that their high intensity light outputs overlap one another, so that all points of the flexographic plate are continuously exposed by at least one of light sources 14. This is in contrast to prior single-lamp systems in which any particular point on the plate is exposed to light in a pulsing pattern. This continuous exposure is considerably more effective in exposing the plate properly than pulsing exposure achieved by the prior art.

Figure 3:
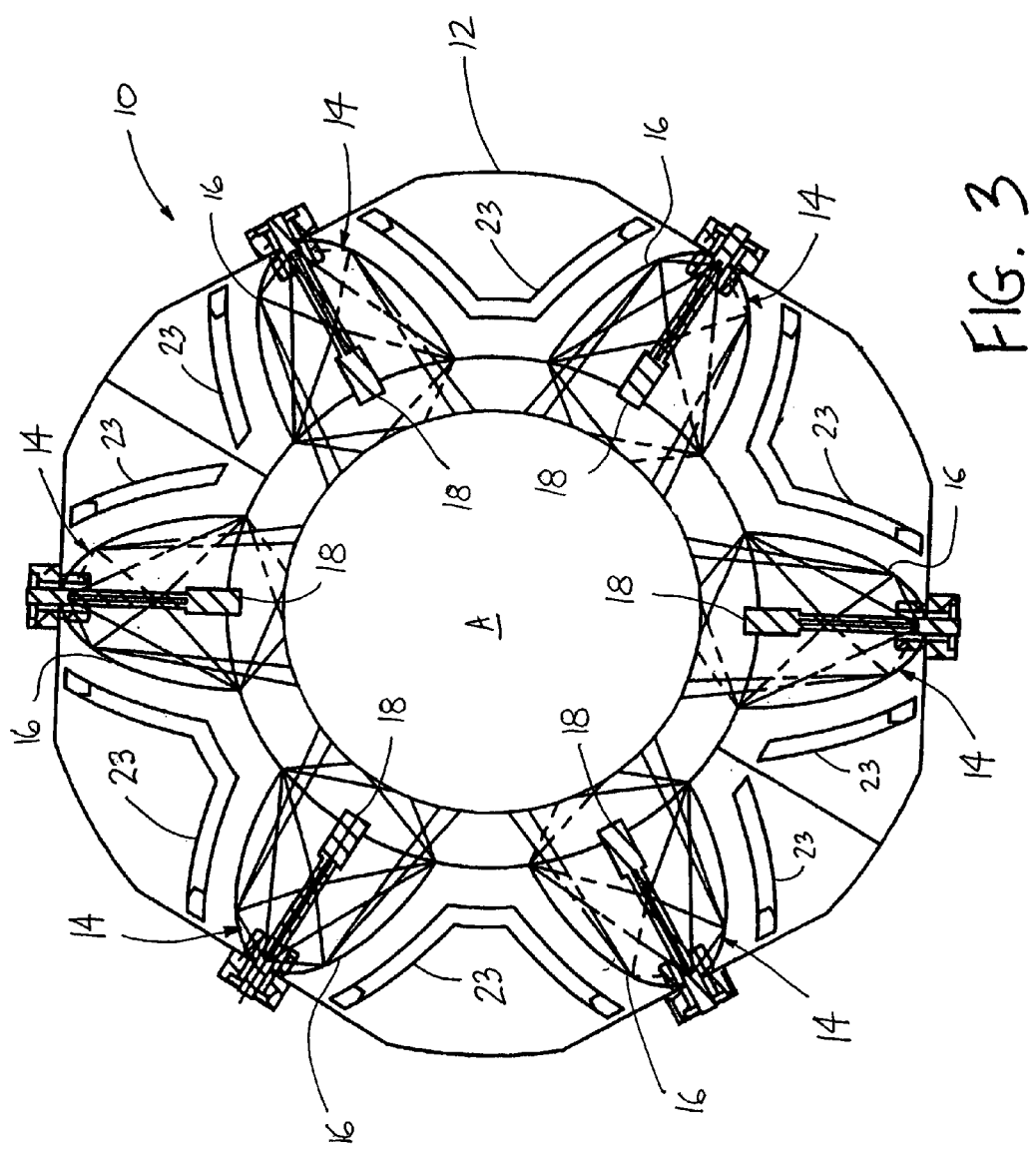
FIG. 3 is a cross-sectional view of the exposure system shown in FIGS. 1A and 1B, taken along line 3—3 of FIG. 1B.

FIG. 3 is a cross-sectional view of exposure system 10 taken along line 3—3 of FIG. 1B. FIG. 3 illustrates the paths of light rays produced by light sources 14 in the body 12 of exposure system 10, showing how the light produced by lamps 18 is reflected by parabolic reflectors 16. FIG. 3 also shows the configuration of chambers 23 in body 12, which form a path for the flow of cooling liquid to cool heat produced by light sources 14. As shown in FIG. 3, there are six light sources 14 around the circumference of body 12 in an exemplary embodiment, although there could be more or fewer in alternate configurations. In addition, an alternative configuration may employ fewer light sources (as few as one in some embodiments), with the output(s) of the light source(s) being piped or otherwise directed to a plurality of light outputs so that continuous exposure of all points of the flexographic plate is achieved.

Figure 4:
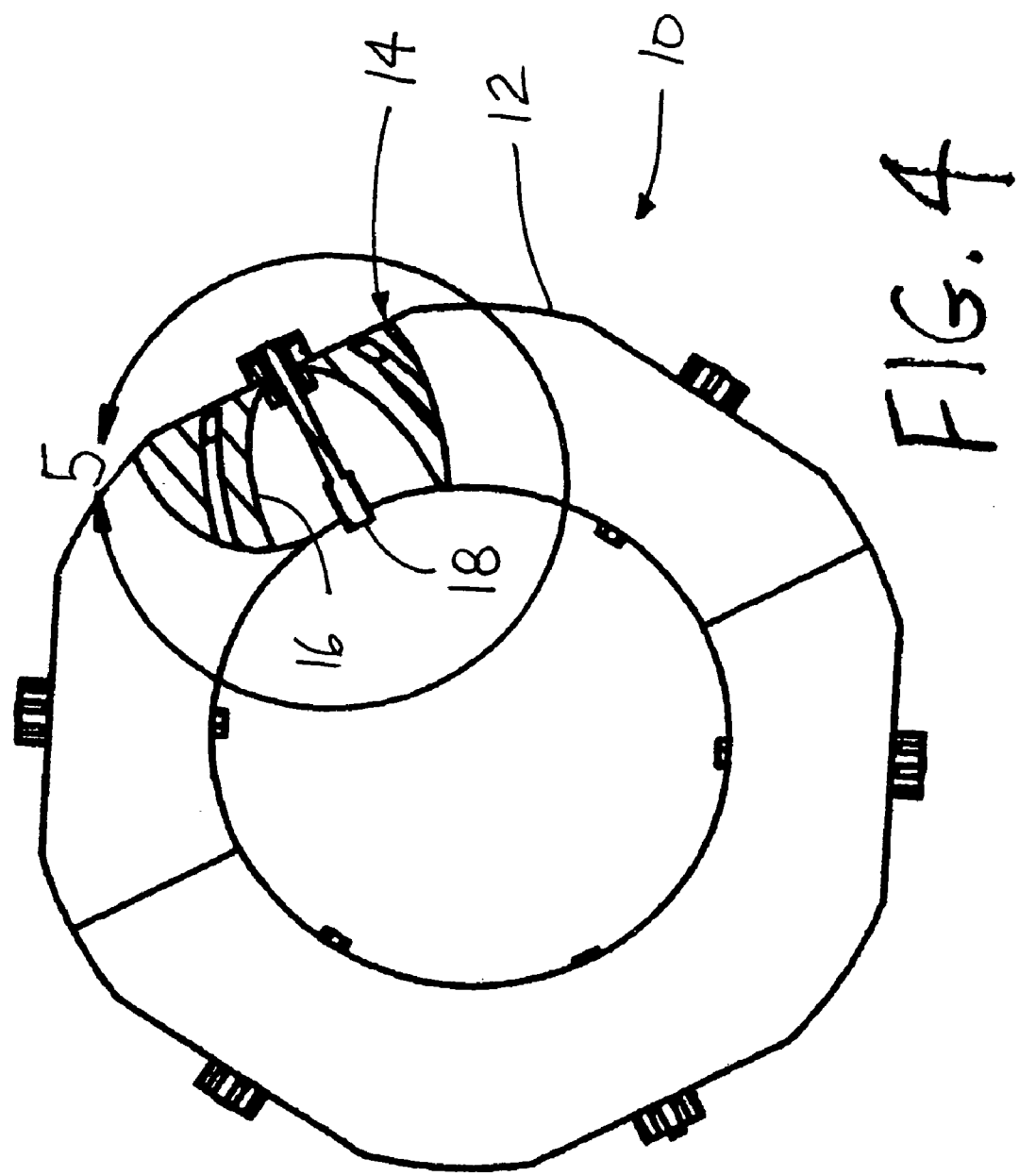
FIG. 4 is a front view of the exposure system shown in FIG. 1A, with a portion shown in section.

FIG. 4 is a front view of the exposure system 10 shown in FIG. 1A, with a portion shown in section, and FIG. 5 is an enlarged view of the portion of FIG. 4 that is shown in section. FIGS. 4 and 5 illustrate the configuration of each of the individual high intensity light sources 14 provided around the circumference of body 12 of exposure system 10. In an exemplary embodiment, light source 14 includes lamp 18 that is a 1000 Watt mercury plasma capillary lamp, located in parabolic reflector 16 that is coated with a dichroic coating on its inner surface so that actinic (ultraviolet) radiation is reflected and all other (non-useful) radiation is absorbed. Reflector 16 is parabolic in one exemplary embodiment, but may have a different geometry selected to control an illumination angle of light directed onto the flexographic plate. The mercury plasma capillary light source is advantageous for several reasons, such as its instant-on capability, its ability to focus light in a short distance, its efficiency, etc. However, many principles of the present invention may be achieved by other types of light sources as well.

In some embodiments, it is useful to be able to dynamically control an intensity of the light provided by light sources 14. This control is readily achievable by the plasma capillary lamp described above, simply by connecting control system 24 to lamp 18 and operating control system 18 to adjust the light intensity output by lamp 18. Similar control is achievable with other types of light sources as well.

The present invention provides an exposure system that is usable in combination with an ablation system to continuously expose an ablated, rotating flexographic photopolymer plate. The exposure system has a plurality of light outputs provided by one or more light sources, so that all points on the photopolymer are continuously exposed. This system provides a high degree of efficiency in its ability to ablate and expose a photopolymer in an integrated process, and also provides very effective exposure by ensuring that all points are continuously exposed with high intensity light, rather than exposed in a pulsing pattern.

Although the present invention has been described with reference to preferred embodiments, workers skilled in the art will recognize that changes may be made in form and detail without departing from the spirit and scope of the invention.

What is claimed is:

1. A system for exposing a photopolymer with ultraviolet light, comprising:
   a rotation system for rotating the photopolymer; and
   a light source assembly arranged around the rotation system, the light source assembly including at least one light source providing a plurality of light outputs for directing light onto the photopolymer and being movable across a length of the photopolymer perpendicular to a direction of rotation of the photopolymer, the plurality of light outputs being arranged so that their light rays overlap one another, thereby continually exposing all points on the photopolymer with at least one light output.

2. The system of claim 1, wherein the light source assembly includes a plurality of light sources arranged around the rotating system to provide the plurality of light outputs.

3. The system of claim 2, wherein the plurality of light sources each comprise a plasma capillary lamp.

4. The system of claim 1, wherein the at least one light source includes a reflector coated with a dichroic coating that reflects only actinic radiation.

5. The system of claim 1, wherein the reflector has a geometry selected to control an illumination angle of light directed onto the photopolymer.

6. The system of claim 1, wherein the light source assembly includes a liquid cooled body supporting the at least one light source.

7. The system of claim 1, further comprising:
   a control system coupled to the at least one light source for dynamically controlling an intensity of the plurality of light outputs.

8. The system of claim 1, wherein the light source assembly is configured with a toroidal geometry around the rotation system, having the light outputs directed toward the rotation system inside the toroidal geometry.

9. The system of claim 1, wherein the photopolymer is a printing plate, and the rotation system is a rotatable drum on which the printing plate is mounted.

10. The system of claim 1, wherein the photopolymer is a cylindrical printing sleeve that is rotatable by the rotation system.

11. A method of exposing a photopolymer with ultraviolet light, comprising:
   rotating the photopolymer;
   directing light from a light source assembly onto the photopolymer from all directions in an overlapping pattern, thereby continually exposing all points on the photopolymer with light; and
   moving the light source assembly across a length of the photopolymer perpendicular to a direction of rotation of the photopolymer to expose all of the photopolymer.

12. The method of claim 11, wherein directing light from the light source assembly onto the photopolymer comprises energizing a plurality of light sources arranged around the photopolymer.

13. The method of claim 11, wherein each of the plurality of light sources comprises a plasma capillary lamp.

14. The method of claim 11, wherein each of the plurality of light sources include a reflector coated with a dichroic coating that reflects only actinic radiation.

15. The method of claim 14, wherein the reflector has a geometry selected to control an illumination angle of light directed onto the photopolymer.

16. The method of claim 11, further comprising liquid cooling the light source assembly.

17. The method of claim 11, further comprising dynamically controlling an intensity of the light provided by the light source assembly to control exposure of the photopolymer.

18. A system for ablating a photopolymer and exposing the photopolymer with ultraviolet light, comprising:
   a rotation system for rotating the photopolymer;
   an ablation assembly for ablating the photopolymer in a controlled pattern representing a graphical image; and
   a light source assembly arranged around the rotation system, the light source assembly including at least one light source providing a plurality of light outputs for directing light onto the photopolymer and being movable across a length of the photopolymer perpendicular to a direction of rotation of the photopolymer, the plurality of light outputs being arranged so that their light rays overlap one another, thereby continually exposing all points on the photopolymer with at least one light output.

19. The system of claim 18, wherein the light source assembly includes a plurality of light sources arranged around the rotating system to provide the plurality of light outputs.

20. The system of claim 19, wherein the plurality of light sources each comprise a plasma capillary lamp.

21. The system of claim 18, wherein the at least one light source includes a reflector coated with a dichroic coating that reflects only actinic radiation.

22. The system of claim 18, wherein the reflector has a geometry selected to control an illumination angle of light directed onto the photopolymer.

23. The system of claim 18, wherein the light source assembly includes a liquid cooled body supporting the at least one light source.

24. The system of claim 18, further comprising:
 a control system coupled to the at least one light source for dynamically controlling an intensity of the plurality of light outputs.

25. The system of claim 18, wherein the light source assembly is configured with a toroidal geometry around the rotation system, having the light outputs directed toward the rotation system inside the toroidal geometry.

26. The system of claim 18, wherein the photopolymer is a printing plate, and the rotation system is a rotatable drum on which the printing plate is mounted.

27. The system of claim 18, wherein the photopolymer is a cylindrical printing sleeve that is rotatable by the rotation system.

* * * * *